United States Patent
Ramaswamy et al.

(10) Patent No.: US 7,269,754 B2
(45) Date of Patent: Sep. 11, 2007

(54) METHOD AND APPARATUS FOR FLEXIBLE AND PROGRAMMABLE CLOCK CROSSING CONTROL WITH DYNAMIC COMPENSATION

(75) Inventors: Sridhar Ramaswamy, Folsom, CA (US); Amit Bodas, Folsom, CA (US); Zohar B. Bogin, Folsom, CA (US); David E. Freker, Sacramento, CA (US); Suryaprasad R. Kareenahalli, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 525 days.

(21) Appl. No.: 10/335,418

(22) Filed: Dec. 30, 2002

(65) Prior Publication Data

US 2004/0128580 A1    Jul. 1, 2004

(51) Int. Cl.
    *G06F 1/02* (2006.01)
(52) U.S. Cl. .................. 713/401; 713/503; 713/601
(58) Field of Classification Search ............. 713/400, 713/401, 500–503, 600–601
    See application file for complete search history.

(56) References Cited

U.S. PATENT DOCUMENTS

| | | | | |
|---|---|---|---|---|
| 5,056,120 | A * | 10/1991 | Taniguchi et al. | 375/371 |
| 5,392,437 | A * | 2/1995 | Matter et al. | 713/324 |
| 6,198,420 | B1 * | 3/2001 | Ryan et al. | 341/155 |
| 6,564,335 | B1 | 5/2003 | Freker | 713/600 |
| 6,724,683 | B2 * | 4/2004 | Liao | 365/233 |
| 6,765,423 | B2 * | 7/2004 | Higuchi | 327/270 |
| 6,775,755 | B2 * | 8/2004 | Manning | 711/167 |
| 2002/0194520 | A1 * | 12/2002 | Johnson | 713/600 |
| 2003/0081713 | A1 * | 5/2003 | Pontius et al. | 375/372 |
| 2004/0003194 | A1 | 1/2004 | Bodas et al. | 711/167 |
| 2004/0090246 | A1 * | 5/2004 | Gans | 327/57 |
| 2004/0123060 | A1 | 6/2004 | Bodas et al. | 711/167 |

\* cited by examiner

*Primary Examiner*—Rehana Perveen
*Assistant Examiner*—Fahmida Rahman
(74) *Attorney, Agent, or Firm*—Caven & Aghevli LLC

(57) ABSTRACT

A system and method for crossing clocks from a source clock to a destination clock is disclosed. In one embodiment, a source clock phase enable signal is used to enable a set of latch components to selectively input a source clock pulse. The outputs of the latch components may be selected by a multiplexor according to the phases of the destination clock. In another embodiment, a time delay may be passed into the destination clock domain and may be calculated by a number of destination clock cycle time periods. In certain circumstances, the time delay may be adjusted to compensate for longer delays in the clock crossing process.

19 Claims, 9 Drawing Sheets

METHOD AND APPARATUS FOR FLEXIBLE AND PROGRAMMABLE CLOCK CROSSING CONTROL WITH DYNAMIC COMPENSATION

FIELD

The present disclosure relates generally to microprocessor systems, and more specifically to microprocessor systems capable of operating with a system bus at a different clock speed than the system memory.

BACKGROUND

A common design consideration in modern digital systems is the use of clocks of differing clock frequencies in different portions of the system. One example of such a situation arises in microprocessor systems, where the system bus may utilize a clock at a different frequency than the clock utilized by system memory. Data read from memory at one clock frequency may need to be resynchronized to the clock frequency of the system bus. Data written into the memory, conversely, may need to be resynchronized from the clock frequency of the system bus to the clock frequency of the memory. The distinction may be made between source clock domains and destination clock domains. A source clock domain may describe the circuitry that generates a signal in accordance with a source clock, and a destination clock domain may describe the circuitry that receives that signal, but now in accordance with a destination clock. It is noteworthy that this distinction may change many times during the operation of the circuitry. A memory may be within the source clock domain during a data read transaction but may be within the destination clock domain during a data write transaction. Command pulses crossing the boundary from one domain to another may additionally change what is the source clock domain and destination clock domain. More generally, the process of resynchronizing a signal going from a source clock domain into a destination clock domain may be referred to as a clock-crossing scheme.

Simple clock crossing schemes may utilize double synchronous flops in the destination clock domain to cross clock domains. Such methods may add unnecessary latency into the system timing. Therefore such a method may not be particularly attractive when used in higher speed systems, where any delays induced in clock crossing may impact various system latencies. An additional issue may arise with timing of events such as memory reads. If a time period before data signals are valid must be accounted for, when crossing over to the destination clock domain additional delays may be introduced by the clock crossing scheme.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The following description describes techniques for resynchronizing signals crossing boundaries between source clock domains and destination clock domains. In the following description, numerous specific details such as logic implementations, software module allocation, bus signaling techniques, and details of operation are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation. The invention is disclosed in the form of a memory controller within a microprocessor system. However, the invention may be practiced in other forms of circuits that have multiple clock domains.

Figure 1:
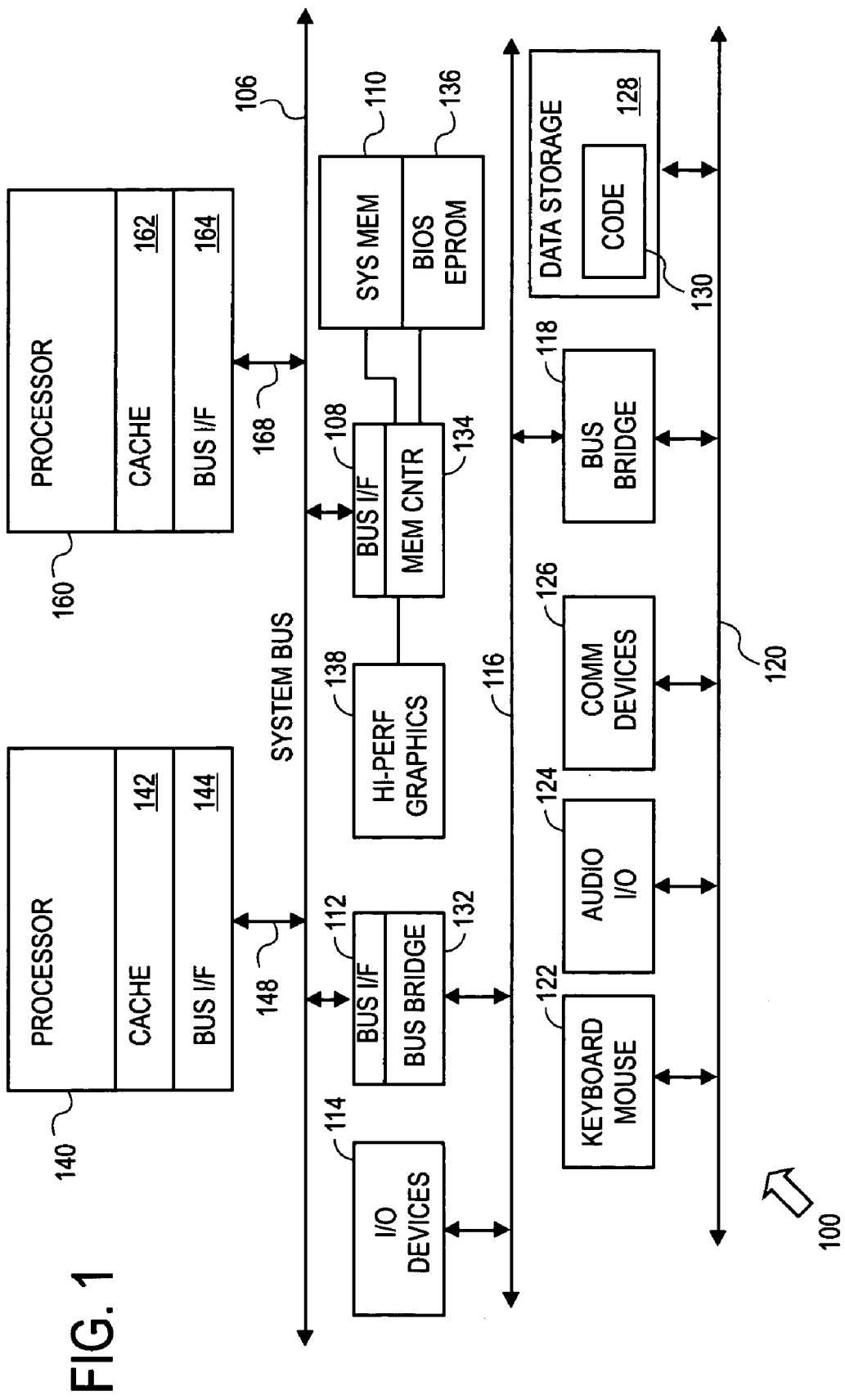
FIG. 1 is a schematic diagram of a multiprocessor system, according to one embodiment.

Referring now to FIG. 1, a schematic diagram of a multiprocessor system 100 is shown, according to one embodiment. The FIG. 1 system may include several processors of which only two, processors 140, 160 are shown for clarity. Processors 140, 160 may include level one caches 142, 162. The FIG. 1 multiprocessor system 100 may have several functions connected via bus interfaces 144, 164, 112, 108 with a system bus 106. A general name for a function connected via a bus interface with a system bus is an "agent". Examples of agents are processors 140, 160, bus bridge 132, and memory controller 134.

Memory controller 134 may permit processors 140, 160 to read and write from system memory 110 and from a basic input/output system BIOS erasable programmable read-only memory EPROM 136. In some embodiments BIOS EPROM 136 may utilize flash memory. Memory controller 134 may include a bus interface 108 to permit memory read and write data to be carried to and from bus agents on system bus 106. Memory controller 134 may also connect with a high-performance graphics circuit 138 across a high-performance graphics interface 139. In certain embodiments the high-performance graphics interface 139 may be an advanced graphics port AGP interface, or an AGP interface operating at multiple speeds such as 4× AGP or 8× AGP. Memory controller 134 may direct read data from system memory 110 to the high-performance graphics circuit 138 across high-performance graphics interface 139. It is noteworthy that bus interface 108, system memory 110, and high-performance graphics circuit 138 may each be in a different clock domain.

Bus bridge 132 may permit data exchanges between system bus 106 and bus 116, which may be a industry standard architecture ISA bus or a peripheral component interconnect PCI bus. There may be various input/output I/O devices 114 on the bus 116, including low performance graphics controllers, video controllers, and networking controllers. Another bus bridge 118 may be used to permit data exchanges between bus 116 and bus 120. Bus 120 may be a small computer system interface SCSI bus, an integrated drive electronics IDE bus, or a universal serial bus USB bus. Additional I/O devices may be connected with bus 120. These may include keyboard and cursor control devices 122, including mice, audio I/O 124, communications devices 126, including modems and network interfaces, and data storage devices 128, including magnetic disk drives and optical disk drives. Software code 130 may be stored on data storage device 128. In some embodiments memory controller 134 and bus bridge 132 may collectively be referred to as a chipset. In some embodiments, functions of a chipset may be divided among physical chips differently than as shown in the FIG. 1 embodiment.

Figure 2:
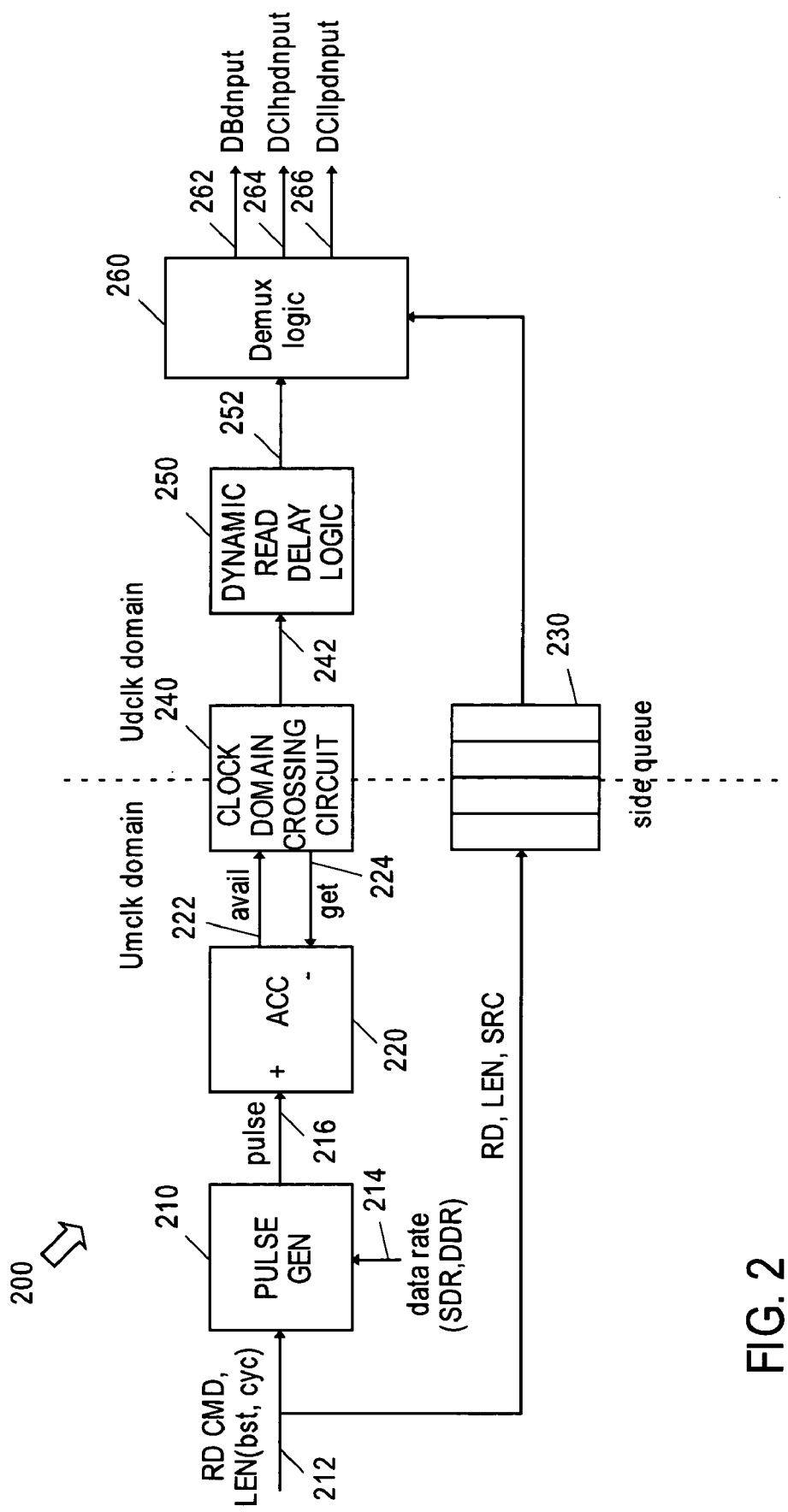
FIG. 2 is a schematic diagram of a clock domain crossing circuit, according to one embodiment.

Referring now to FIG. 2, a schematic diagram of a clock domain crossing circuit 200 is shown, according to one embodiment. Clock domain crossing circuit 200 may be a portion of memory controller 134 of FIG. 1. Clock domain crossing circuit 200 may include a pulse generator 210, an accumulator 220, a clock domain crossing circuit 240, a dynamic read delay logic 250, a side queue 230, and a demultiplexor logic 260. The accumulator 220, clock domain crossing circuit 240, and dynamic read delay logic 250 are discussed in detail in connection with FIGS. 3, 4, and 7 below. FIG. 2 shows a memory clock Umclk domain and a databus clock Udclk domain. In this embodiment the Umclk domain is the source clock domain and the Udclk domain is the destination clock domain for read data coming from memory.

Pulse generator 210 may generate read data pulses, responsive to a memory read command, that may indicate when to sample read data coming from memory. The data pulse generation for each read command that is launched may depend upon an input signal 212 that may in some embodiments include the read command pulse itself, the burst length, the cycle length, and on selective commands per clock CPC (if applicable). The data pulse generation may also depend upon a DRAM type signal input 214 that may in one embodiment identify the kind of dynamic random-access memory DRAM used as system memory 110. The data pulse may have no knowledge of details of DRAM operation, such as the column access strobe CAS timing and the time until read data is valid $T_{RD}$. Pulse generator 210 may generate pulses having a timing such that all chunks of data returned from the system memory 110 for a given cycle type and burst length will be valid a clock period after that pulse is sampled high. In one embodiment, if the read command is launched during clock K, then the read data pulse may be launched relative to K as given below in Table I.

TABLE I

| CYCLE LEN. | DRAM | BURST LEN. | PULSE TIMING |
|---|---|---|---|
| 16 bits | SDK | 4 | K + 1 |
| 32 bits | SDR | 4 | K + 3 |
| 16 bits | DDR | 4/8 | K |
| 32 bits | DDR | 4/8 | K + 1 |
| 64 bits | DDR | 8 | K + 1, K + 3 |

Here SDR is single data rate DRAM and DDR is dual data rate DRAM. An additional parameter that may affect the data pulse timing is selective CPC for 2×16 bits read commands, generally applicable to DDR. In one embodiment the effect of selective CPC on read data pulse timing may be as given below in Table II.

TABLE II

| DRAM | SELECTIVE CPC | PULSE TIMING |
|---|---|---|
| SDR | must be OFF | K + 3 |
| DDR | set OFF | K + 2 |
| DDR | set ON | K + 1 |

Side queue 230 may be used to convey portions of the input signal 212 to the demultiplexor logic 260. In one embodiment, the portions send through side queue 230 may include cycle length, burst length, and destination device. Demultiplexor logic 260 may then use this information in conjunction with the clock-crossed data pulse (on line 252 in FIG. 2) to Form a device-specific read data pulse. Examples of these may include a data bus read data pulse (DBdnput 262), a high-speed graphics read data pulse (DClhpdnput 264), and a low-speed graphics read data pulse (Dcllpdnput 266).

Figure 3:
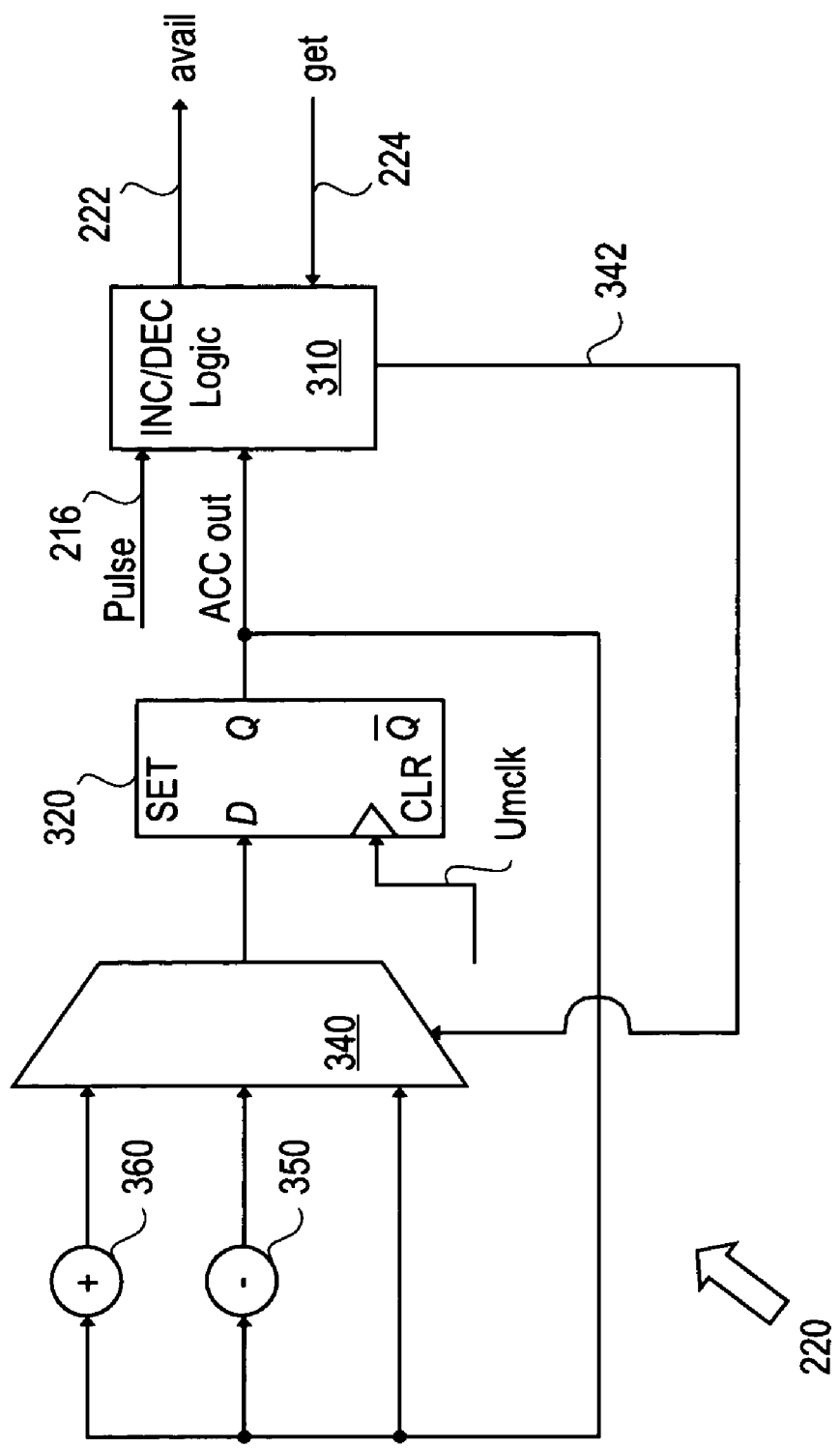
FIG. 3 is a schematic diagram of a pulse accumulator, according to one embodiment of the present disclosure.

Referring now to FIG. 3, a schematic diagram of a pulse accumulator 220 is shown, according to one embodiment of the present disclosure. Accumulator 220 may include an increment/decrement logic 310, a wide latch 320, a multiplexor 340, an incrementor 360, and a decrementor 350. The wide latch 320 may in one embodiment be either 4 or 8 bits wide, with a common clock connection. Wide latch 320 may contain the current count of the number of outstanding data pulses that have not yet been crossed over from the source clock domain to the destination clock domain. Incrementor 360 may increment the number stored in wide latch 320 and present it to an input of multiplexor 340. Similarly, decrementor 350 may decrement the number stored in wide latch 320 and present it to another input of multiplexor 340.

When a pulse enters increment/decrement logic 310 on pulse signal line 216, the increment/decrement logic 310 may set a multiplexor select signal 342 to select the output from incrementor 360 to pass from multiplexor 340 and update the contents of wide latch 320. When a pulse has been crossed over from the source clock domain to the destination clock domain, then a get signal on get signal line 224 may be sent to increment/decrement logic 310. Increment/decrement logic 310 may then set a multiplexor select signal 342 to select the output from decrementor 350 to pass from multiplexor 340 and update the contents of wide latch 320. A get signal on get signal line 224 may additionally permit the increment/decrement logic 310 to release a pulse as an available mclk pulse over available mclk pulse signal line 222. When neither a pulse nor a get signal arrive at increment/decrement logic 310, then the current contents of wide latch 320 are retained.

Figure 4:
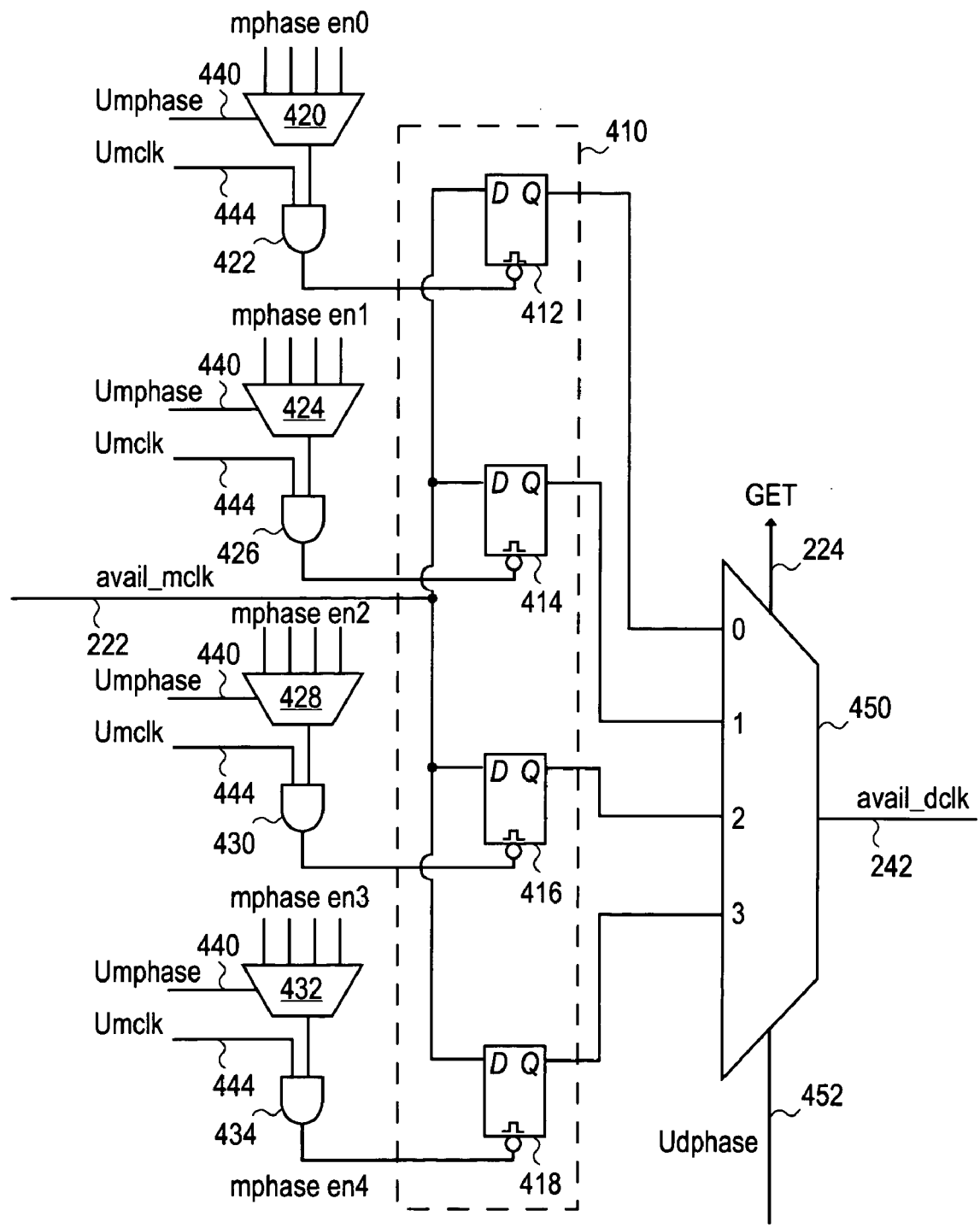
FIG. 4 is a schematic diagram of a clock domain crossing circuit, according to one embodiment of the present disclosure.

Referring now to FIG. 4, a schematic diagram of a clock domain crossing circuit 240 is shown, according to one embodiment of the present disclosure. Available mclk pulses arrive over available mclk pulse signal line 222. These available mclk pulses are routed to the data inputs of latch components 412, 414, 416, 418 of latch 410. The clock crossing circuit 240 generally may require a quantity of latch components m when m is the number of destination clock phases available per source clock phase present in a given embodiment.

The source clock clocking signals are presented in two components, the clock itself Umclk routed on Umclk signal line 444 and a phase indicator signal Umphase routed on Umphase signal line 440. Umphase signal line 440 may be 1, 2, or more bits wide in various embodiments. In the FIG. 4 embodiment Umphase signal line 440 is 3 bits wide. The Umphase signal line 440 is presented to the selector inputs of multiplexors 420, 424, 428, 432. The multiplexors 420, 424, 428, 432 are used as selectors in the FIG. 4 embodiment, but in other embodiments other circuit elements may be used as selectors. Each of multiplexors 420, 424, 428, 432 may have as inputs phase enable signals mphase en0, mphase en1, mphase en2, and mphase en3. In one embodiment these phase enable signals may be determined through an analysis taking into account differences in process variation, operating temperature, and operating voltage. In the FIG. 4 embodiment the phase enable signals mphase en0, mphase en1, mphase en2, and mphase en3 may be read from a register that is loaded from a BIOS, but in other embodiments may be stored in differing ways including as software code on a data storage device.

Each of the latch components 412, 414, 416, 418 of latch 410 corresponds to a particular phase of Udphase, as assigned by their connection to multiplexor 450. Here multiplexor 450 is one example of a selector circuit. In other embodiments, the selector circuit used may be of another type. The inputs of multiplexor 450 are selected by phase indicator signal Udphase routed on Udphase signal line 452. Hence the output Q of latch component 412 is connected to the "0" input of multiplexor 450, selected when in phase "0" of Udphase. Similarly the Q outputs of latch components 414, 416, 418 correspond to the "1", "2", and "3" phases of Udphase, respectively.

Therefore, the various mphase enx signals may relate the permissibility of available mclk pulses occurring within a particular Umphase to cross over to a corresponding Udphase of the destination clock, Udclkc, over available dclk pulse signal line 242. Available mclk pulses crossing over to, for example, phase "0" of Udphase, generally go through latch component 412. Therefore the combination of Umolk and the phase enable signal mphase en0, combined by gate 422, determine whether or not a given available mclk pulse may be latched into latch component 412. Similar considerations apply to latch components 414, 416, 418.

Figure 5:
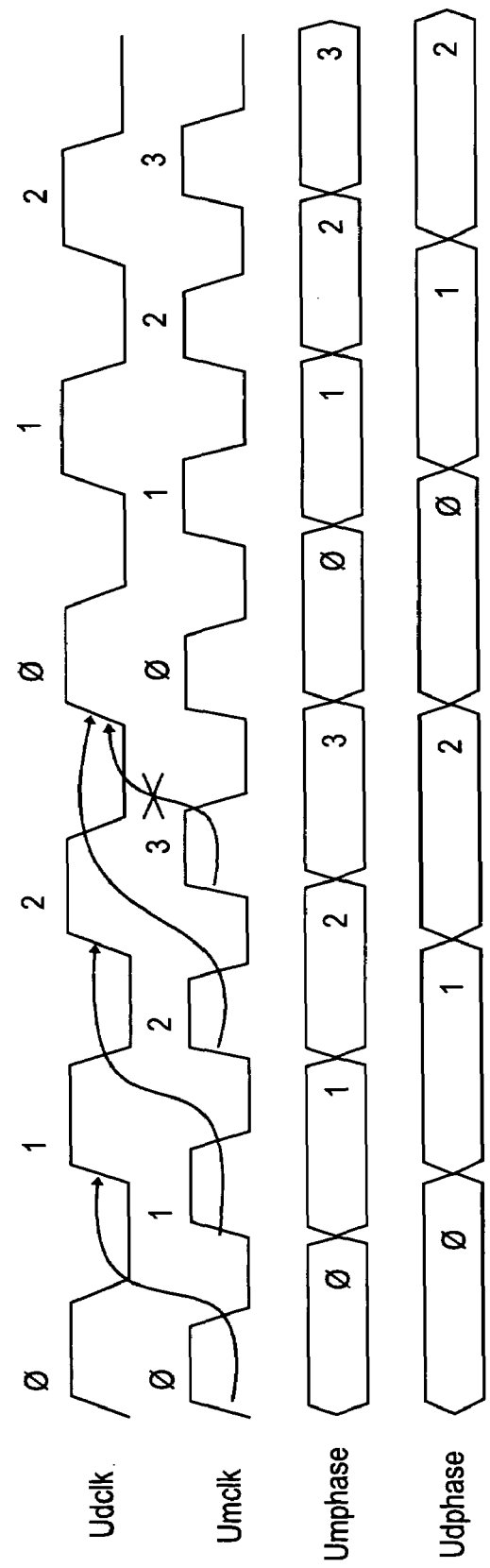
FIG. 5 is a timing diagram of the clock domain crossing circuit of FIG. 4, according to one embodiment of the present disclosure.

Referring now to FIG. 5, a timing diagram of the clock domain crossing circuit 240 of FIG. 4 is shown, according to one embodiment of the present disclosure. Here the ratio of frequencies of the source clock mclk to the destination clock dclk is 4 to 3. In other embodiments, other ratios could be used. Available mclk pulses arriving during Umphase "0" may be crossed over to an available dclk pulse during the next Udphase "1". Available mclk pulses arriving during Umphase "1" may be crossed over to an available dclk pulse during the next Udphase "2". Available mclk pulses arriving during Umphase "2" may be crossed over to an available dclk pulse during the next Udphase "0". However, available mclk pulses arriving during Umphase "3" may not be crossed over to an available dclk pulse during the next Udphase "0", and should be crossed over into a later phase of Udphase.

Figure 6:
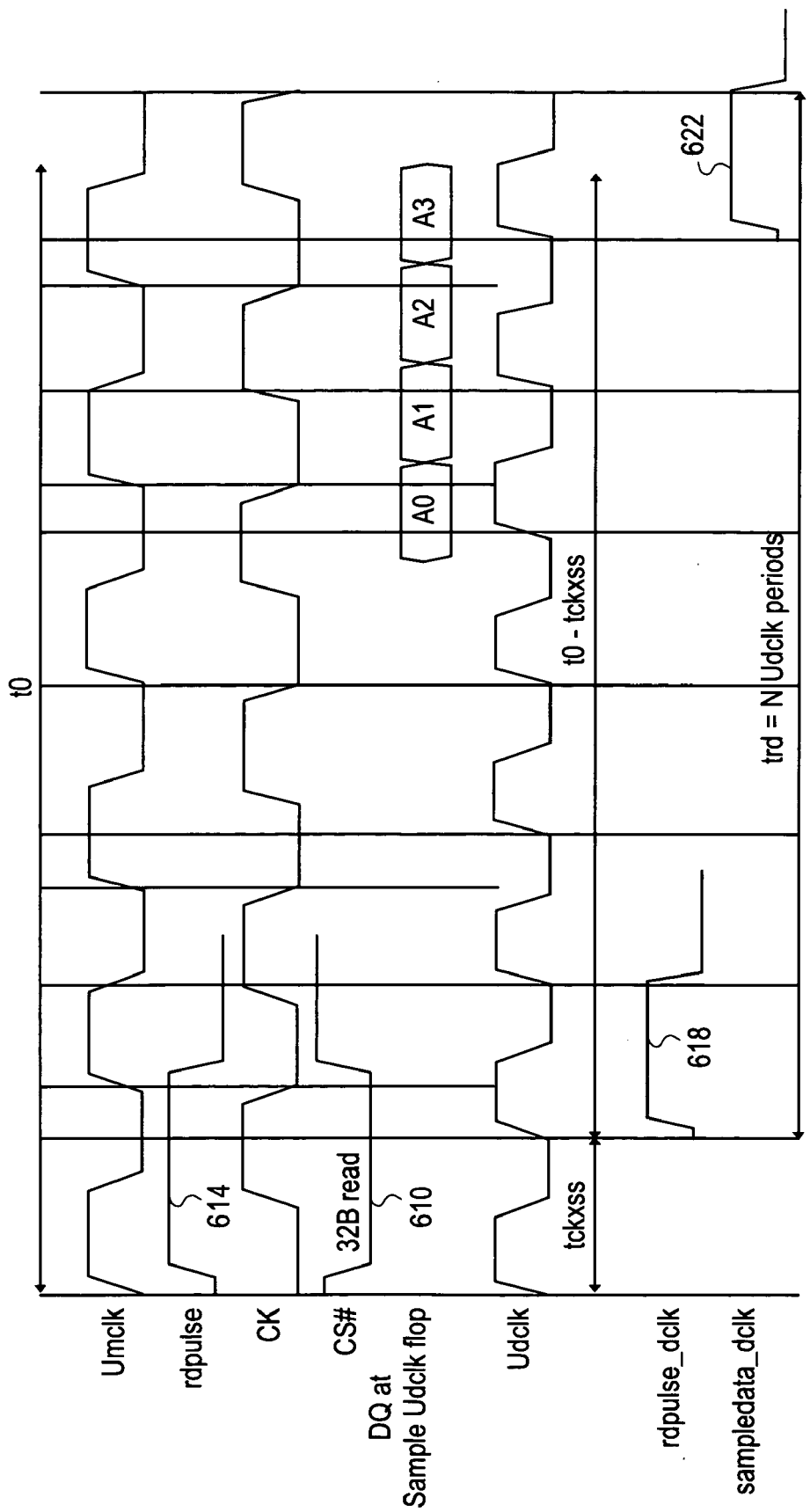
FIG. 6 is a timing diagram of a dynamic read delay logic, according to one embodiment of the present disclosure.

Referring now to FIG. 6, a timing diagram of a dynamic read delay logic is shown, according to one embodiment of the present disclosure. A memory read transaction is initiated, in one example for a 32 bit read, by generating a pulse 610 on chip select CS# signal line. A corresponding read data pulse 614 in the Umclk domain is generated in response. By measurement or circuit simulation, and taking into account variations in process, voltage, and temperature, it may be determined that the read data from memory may be safely sampled after a delay time t0 subsequent to the initial edge of pulse 610.

However, pulse 610 is in the Umclk domain. Upon crossing read data pulse 614 from Umclk domain to form read data pulse 618, a different delay time $t_{rd}$ should be determined. Here the delay time $t_{rd}$ is the time subsequent to the rising edge of read data pulse 618 when the read data may be safely sampled. The delay time $t_{rd}$ may be determined by counting forward N cycles of the Udclk, where $$N(\Phi)=\text{greatest integer } ((t0-tckxss(\Phi))/(\text{frequency of } Udclk))+1.$$

Here $tckxss(\Phi)$ may be dependent on the launch phase of Umclk and the aggressiveness of the clock crossing programming (e.g. the values of the mphase emx). In certain combinations of source clock and destination clock phases, where there is a larger time delay induced in the clock crossing, it may be possible to reduce the above value of $N(\Phi)$ by 1 or more.

Using the above equation for calculating values of $N(\Phi)$, it is possible to calculate a set of values for various combinations of $t_{rd}$ and the phases of Umclk in which the read transaction is initiated. This set of values may in one embodiment be stored in BIOS in a lookup table format. Based upon the destination clock to source clock ratio and the $t_{rd}$ value, the BIOS stored values for $N(\Phi)$ and for any adjustments needed for $t_{rd}$, called $t_{rd\text{-}adjust}$, may be programmed into a register within the memory controller. A control logic implementation, for one embodiment as shown in FIG. 7 below, may ensure by utilizing the $t_{rd\text{-}adjust}$ that there is no clobbering of previously valid data by unadjusted read data.

Figure 7:
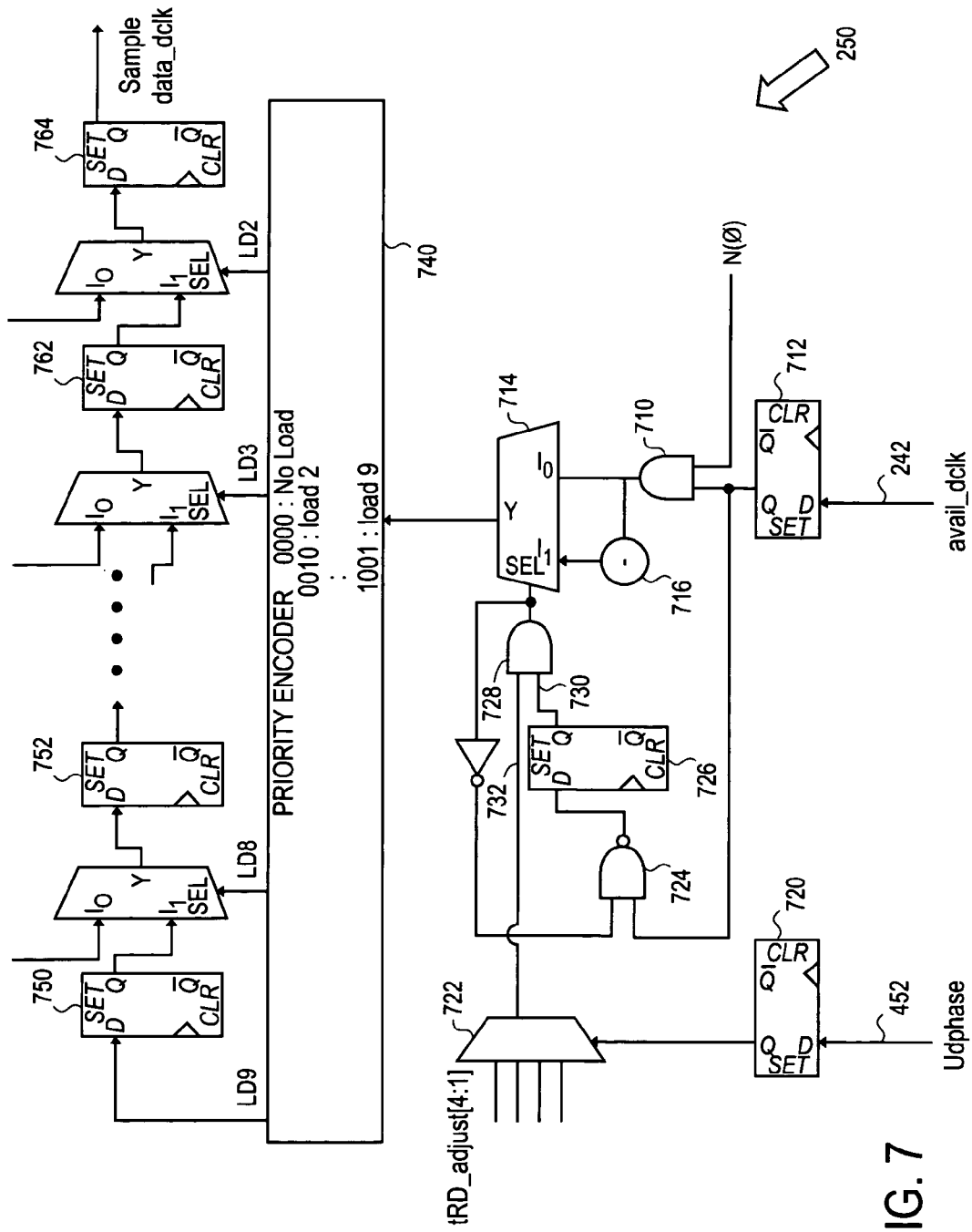
FIG. 7 is a schematic diagram of a dynamic read delay logic, according to one embodiment of the present disclosure.

Referring now to FIG. 7, a schematic diagram of a dynamic read delay logic 250 is shown, according to one embodiment of the present disclosure. Dynamic read delay logic 250 may ensure that the value of $N(\Phi)$, corresponding to a desired value of $t_{rd}$, may be adjusted down by 1 if two conditions are met. The first condition is that the programming values of $t_{rd\text{-}adjust}$ permit the adjustment in the corresponding phase of Udphase. The second condition is that the available dclk pulse does not follow a previous dclk pulse that occurred in a cycle of Udclk immediately before the available dclk pulse. It should be noted that all clock inputs shown in FIG. 7 are connected to Udclk, with individual clock signals not shown for clarity.

The value of $N(\Phi)$ to be used arrives at inputs to the multiple gates 710. In one embodiment, the value of $N(\Phi)$ is 4 bits and there are a corresponding 4 gates 710. When an available dclk pulse is latched into latch 712, then the value of $N(\Phi)$ is presented to the four $I_0$ inputs of selector 714, and decrementor 716 presents $N(\Phi)-1$ to the four $I_1$ inputs of selector 714. The value of the 4 bits wide output of gate 728 determines whether $N(\Phi)$ or $N(\Phi)-1$ is used to count out dclk cycles to form $t_{rd}$ in a given circumstance.

The 2 bits of Udphase 452 may be clocked into the latch elements of latch set 720. Thus the current value of Udphase 452 may select the appropriate value of $t_{rd\text{-}adjust}$ to appear at the output of multiplexor 722 to determine whether or not it would be appropriate to permit the decrementing of $N(\Phi)$. If the output 732 of multiplexor 722 is true, this corresponds to the truth of the first condition: that the programming values of $t_{rd\text{-}adjust}$ permit the adjustment in the corresponding phase of Udphase.

Latch 726 generally contains the presence or absence of an available dclk pulse from the immediately preceding dclk cycle time period. If the output 730 of 726 is true, this corresponds to the truth of the second condition: that the available dclk pulse does not follow a previous dclk pulse that occurred in a cycle of Udclk immediately before the available dclk pulse.

If both the outputs 730, 732 are true, then the 4 bits wide output of selector 714 is N(Φ)−1, otherwise the output of selector 714 is N(Φ). In either case, a value is placed into priority encoder 740. The outputs of priority encoder 740 may be labeled LD2 through LD9. If the input of priority encoder is 0000 binary, then none of the outputs are set low. However, if the input of the priority encoder is x binary, then output LDx is lowered. This causes a pulse to be initiated in the 8 latches 750 through 764, that collectively form a shift register. The farther down the shift register the pulse is injected, the longer the delay $t_{rd}$ will be, as $t_{rd}$ will be either N(Φ) or N(Φ)−1 cycles of dclk in length.

Figure 8:
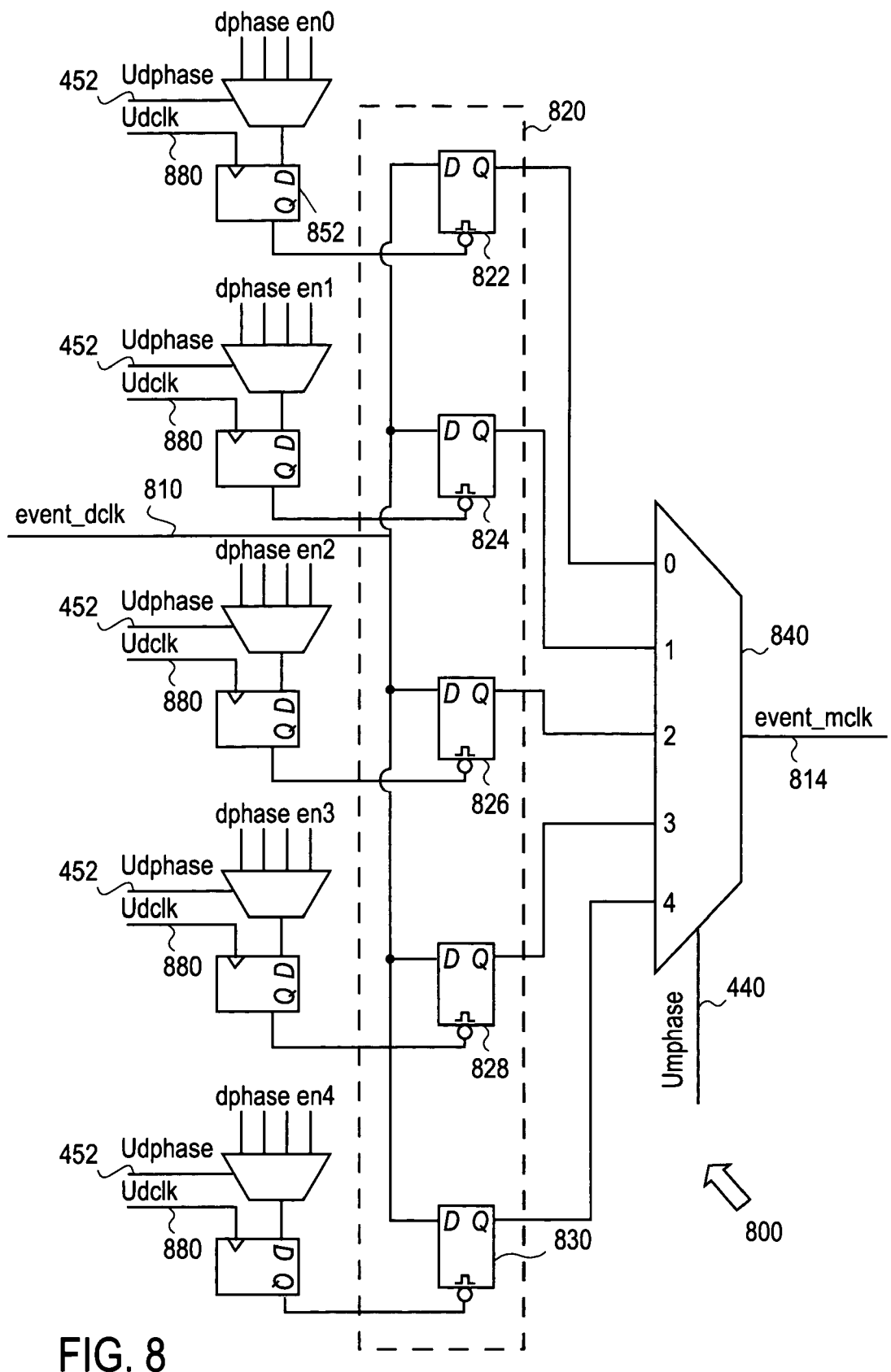
FIG. 8 is a schematic diagram of a clock domain crossing circuit, according to another embodiment of the present disclosure.

Referring now to FIG. 8, a schematic diagram of a clock domain crossing circuit 800 is shown, according to another embodiment of the present disclosure. The clock domain crossing circuit 800 is similar to that shown in 4, but crosses in the opposite direction. In the FIG. 8 embodiment, the dclk is the source clock and the mclk is the destination clock. In the FIG. 8 example, the ratio of mclk frequency to dclk frequency is 5 to 4.

Multiplexor 840 may have 5 inputs, corresponding to the 5 phases of Umphase input on Umphase signal line 440. This requires the 5 latch components 822, 824, 826, 828, 830 of latch 820. The data inputs of latch components 822, 824, 826, 828, 830 are connected to the pulse coming from the dclk domain, event dclk on event dclk signal line 810. In a similar manner to the phase enable signals of FIG. 4, the phase enable signals dphase en0 through dphase en4 may be determined by measurement or simulation, and stored in a BIOS. The BIOS values may then be loaded into a register within the memory controller.

Again the latch components 822, 824, 826, 828, 830 correspond to specific phases of the destination clock Umphase 440. The various dphase enx signals may relate the permissibility of available dclk pulses occurring within a particular Udphase to cross over to a corresponding Umphase of the destination clock, Umclk. Available dclk pulses crossing over to, for example, phase "0" of Umphase, generally go through latch component 822. Therefore the phase enable signal dphase en0, clocked through latch 852 by Udclk 880, determines whether or not a given available dclk pulse may be latched into latch component 822. Similar considerations apply to latch components 824, 826, 828, 830. The output of the latch corresponding to the current Umphase will exit the multiplexor 840 as a clock crossed event mclk pulse on event mclk signal line 814.

Figure 9:
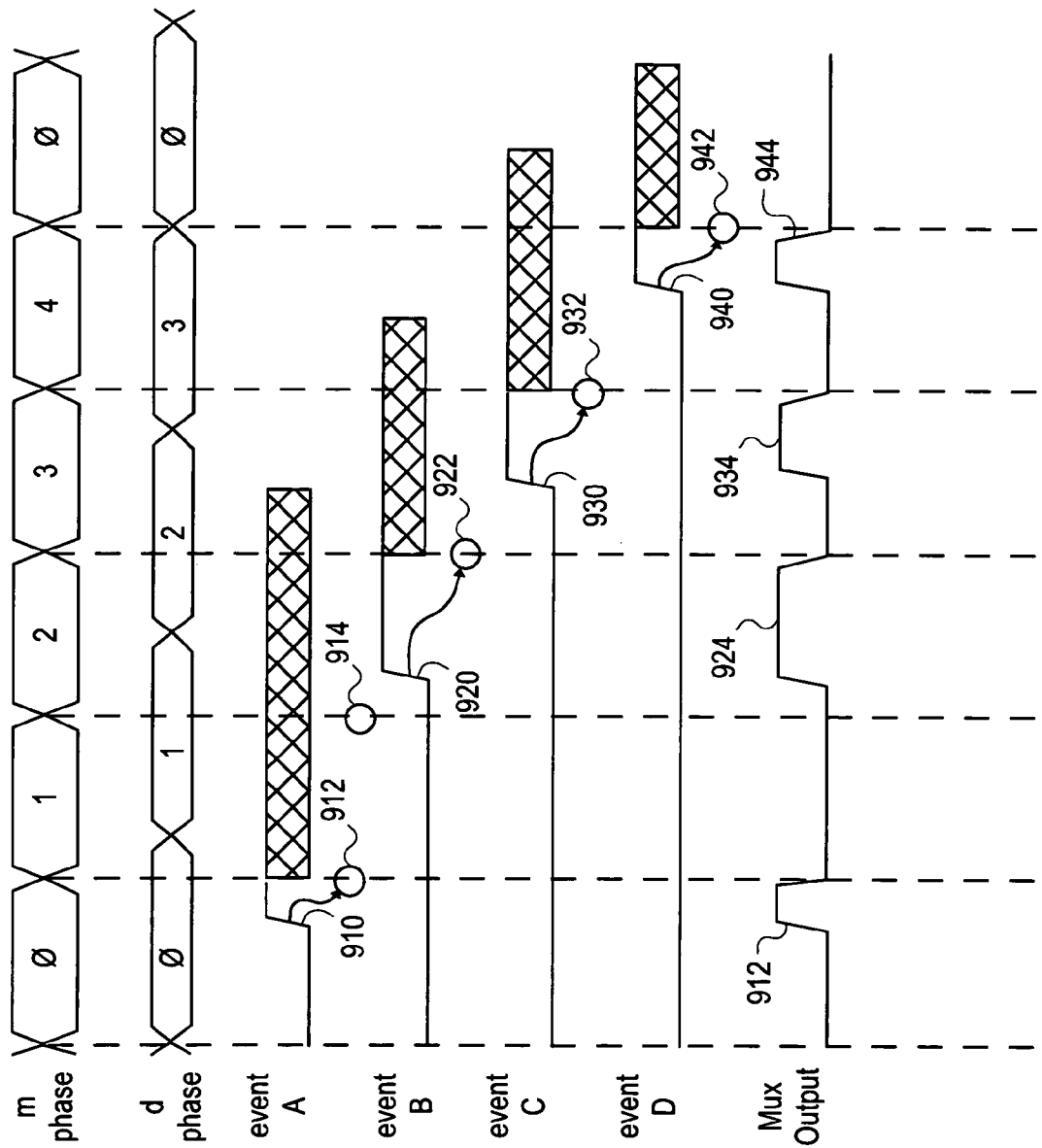
FIG. 9 is a timing diagram of the clock domain crossing circuit of FIG. 8, according to one embodiment of the present disclosure.

Referring now to FIG. 9, a timing diagram of the clock domain crossing circuit of FIG. 8 is shown, according to one embodiment of the present disclosure. The Umphase and Udphase signals are shown. If event A has a transition at 910, then it may be crossed into Umphase "1" at 912. If more conservative timing was selected, the event could be crossed into Umphase "2" at 914. Then when event B has a transition at 920, it may be crossed into Umphase "3" at 922. Similarly event C with a transition at 930 could be crossed into Umphase "4" at 932, and event D with a transition at 940 could be crossed into a next occurring Umphase "0" at 942. The output event mclk is shown as having the 4 pulses 914, 924, 934, and 944.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
    a first selector logic to select a stored phase enable signal responsive to a source clock phase;
    a latch to accept a source clock domain pulse and to reset responsive to said first selector logic;
    a second selector logic to select an output of said latch responsive to a destination clock phase and to output a destination clock domain pulse;
    a delay circuit to delay said destination clock domain pulse a number of domain clock cycles corresponding to a delay time,
    wherein said delay circuit decrements said number if permitted by a select value in a given phase of said destination clock and wherein said delay circuit decrements said number if said destination clock domain pulse does not follow a previous pulse in a cycle of said destination clock immediately before said destination clock domain pulse.

2. The apparatus of claim 1, wherein said first selector logic is to enable said phase enable signal with a source clock.

3. The apparatus of claim 2, wherein said source clock is coupled to said first selector logic with a gate.

4. The apparatus of claim 2, wherein said source clock is coupled to said first selector logic with another latch.

5. The apparatus of claim 1, wherein said phase enable signal is digital.

6. The apparatus of claim 5, wherein said phase enable signal is to be written from basic input output system into a register.

7. The apparatus of claim 1, wherein said first selector logic comprises quantity m multiplexors, where m is the number of destination clock phases possible per source clock phase.

8. The apparatus of claim 7, wherein said latch comprises quantity m latch components, each coupled to one of said m multiplexors.

9. A method, comprising:
    selecting a stored phase enable signal;
    presenting a source clock domain pulse to a latch;
    resetting said latch responsive to said phase enable signal;
    selecting an output of said latch to form a destination clock domain pulse;
    delaying said destination clock domain pulse a number of domain clock cycles corresponding to a determined delay time; and
    decrementing said number if permitted by a programmed value in a given phase of said destination clock,
    wherein decrementing said number is performed if said destination clock domain pulse does not follow a previous pulse in a cycle of said destination clock immediately before said destination clock domain pulse.

10. The method of claim 9, further comprising combining said phase enable signal with a source clock.

11. The method of claim 9, further comprising accumulating said source clock domain pulse until allowed by said latch.

12. A system, comprising:
a first selector logic to select a stored phase enable signal responsive to a source clock phase;
a latch to accept a source clock domain pulse and to reset responsive to said first selector logic;
a second selector logic to select an output of said first latch responsive to a destination clock phase and to output a destination clock domain pulse,
a basic input output system to provide said stored phase enable signal; and
a delay circuit to delay said destination clock domain pulse a number of domain clock cycles corresponding to a determined delay time,
wherein said delay circuit decrements said number if permitted by a programmed value in a given phase of said destination clock and wherein said delay circuit decrements said number if said destination clock domain pulse does not follow a previous pulse in a cycle of said destination clock immediately before said destination clock domain pulse.

13. The system of claim 12, wherein said first selector logic is to enable said phase enable signal with a source clock.

14. The system of claim 12, wherein said first selector logic comprises quantity m multiplexors, where m is the number of destination clock phases possible per source clock phase.

15. The system of claim 14, wherein said latch comprises quantity m latch components, each coupled to one of said m multiplexors.

16. The system of claim 12, further comprising a bus to receive said destination clock domain pulse.

17. The system of claim 16, further comprising a high performance graphics circuit coupled to said bus to receive said destination clock domain pulse.

18. The system of claim 12, further comprising a system memory to generate a read pulse.

19. The system of claim 18, further comprising a pulse generator to derive said source clock domain pulse from said read pulse.

* * * * *